United States Patent [19]

Stanley et al.

[11] Patent Number: 5,751,594
[45] Date of Patent: May 12, 1998

[54] APERTURE CONTROL SYSTEM FOR PRINTED CIRCUIT BOARD FABRICATION

[75] Inventors: Rick J. Stanley, Woburn; Michel M. Raguin, Medford, both of Mass.

[73] Assignee: EMC Corporation, Hopkinton, Mass.

[21] Appl. No.: 33,277

[22] Filed: Mar. 16, 1993

[51] Int. Cl.⁶ ................................................. G06F 17/50
[52] U.S. Cl. ........................ 364/490; 364/488; 364/491; 364/570; 364/DIG. 1; 395/500; 395/763; 395/779; 345/523; 345/441
[58] Field of Search ............................. 364/489, 490, 364/491, 570, 237.7, DIG. 1; 356/401; 395/103, 118, 500, 7.63, 791, 779; 345/441, 523; 382/203

[56] References Cited

U.S. PATENT DOCUMENTS

| | | | |
|---|---|---|---|
| 3,870,922 | 3/1975 | Shutoh | 315/383 |
| 3,906,480 | 9/1975 | Schwartz et al. | 340/324 |
| 4,044,363 | 8/1977 | Morgan | 354/5 |
| 4,054,885 | 10/1977 | Rothgordt | 346/154 |
| 4,254,467 | 3/1981 | Davis et al. | 364/521 |
| 4,254,468 | 3/1981 | Craig | 364/523 |
| 4,257,053 | 3/1981 | Gilbreath | 346/108 |
| 4,395,116 | 7/1983 | Patton, III et al. | 355/32 |
| 4,422,083 | 12/1983 | Neumann et al. | 346/108 |
| 4,492,956 | 1/1985 | Collmeyer et al. | 340/723 |
| 4,496,976 | 1/1985 | Swanson et al. | 358/147 |
| 4,529,978 | 7/1985 | Rupp | 340/727 |
| 4,537,481 | 8/1985 | Witty | 352/89 |
| 4,600,996 | 7/1986 | Kawauchi | 364/491 |
| 4,646,134 | 2/1987 | Komatsu et al. | 358/11 |
| 4,649,497 | 3/1987 | Carlson et al. | 364/491 |
| 4,654,517 | 3/1987 | Reed | 250/201 |
| 4,654,956 | 4/1987 | Reed et al. | 29/568 |
| 4,666,818 | 5/1987 | Lake et al. | 430/256 |
| 4,720,798 | 1/1988 | Reed et al. | 364/489 |
| 4,737,858 | 4/1988 | DeBaryshe | 358/296 |
| 4,867,566 | 9/1989 | Straayer et al. | 356/372 |
| 4,870,286 | 9/1989 | Tobuse | 250/492.2 |
| 4,914,688 | 4/1990 | Kobayashi | 379/93 |
| 4,928,243 | 5/1990 | Hodges et al. | 364/519 |
| 4,945,498 | 7/1990 | Mitamura | 364/521 |
| 5,005,138 | 4/1991 | Tobuse et al. | 364/519 |
| 5,015,553 | 5/1991 | Grandmont et al. | 430/260 |
| 5,138,561 | 8/1992 | Crowe | 364/518 |
| 5,150,225 | 9/1992 | Kreitman | 358/456 |
| 5,157,762 | 10/1992 | Snietka | 395/129 |
| 5,163,128 | 11/1992 | Straayer | 395/129 |
| 5,231,590 | 7/1993 | Kumar et al. | 364/490 |
| 5,254,435 | 10/1993 | Grandmont et al. | 430/260 |
| 5,303,161 | 4/1994 | Burns et al. | 364/489 |

*Primary Examiner*—Kevin J. Teska
*Assistant Examiner*—Thai Phan
*Attorney, Agent, or Firm*—Weingarten, Schurgin, Gagnebin & Hayes LLP

[57] ABSTRACT

An aperture control system comprising a computer aided design workstation for generating CAD aperture data, a data converter for reading the aperture data and generating, in response to the aperture data, converted aperture data, and a PCB optical, laser or other suitable plotter for generating a mask from the converted aperture data.

42 Claims, 6 Drawing Sheets

LIST OF LEGAL APERTURES FOR HADCO
AVAILABLE APERTURES : 1 to 24 and 201 to infinity
58= spotface. img POS 1.0000
59=cir145.0
60=cir10.0
61=cir50.0
62=cir20.0
63=lenkit.img POS 1.0000
64=cir30.0
65=rc20.0x20.0
66=cir80.0
67=rc80.0x80.0
68=cir91.0
69=cir100.0 — 152(a)
70=rc75.0x75.0
71=cir10.0
72=cir75.0
73=petarg.img POS 1.0000
74=cir15.0
75=cir62.0
76=cir65.0
77=cir45.0
78=cir90.0
79=cir75.0
80=rc59.0x59.0
81=cir40.0
82=rc125.0x125.0
83=cir20.0
84=cir13.0
85=cir12.0
86=rc56.0x56.0
87=rc62.0x62.0
88=125tar.img
89=dia068.img
90=cir25.0
91=cir2.0

92=negspot.img POS 1.0000
93=cir5.0
94=rc91.0x91.0
95=cir8.0
96=cir7.0
97=cir3.0
98=rc14.0x14.0
99=cir64.0
100=cir56.0
101=cir54.0
102=cir52.0
103=cir38.0
104=cir36.0
105=cir34.0
106=cir32.0
107=cir28.0
108=cir26.0
109=cir24.0
110=cir60
111=cir58.0
112=h100x80.img POS 1.0000
113=d30x18.img POS 1.0000
114=d50x38.img POS 1.0000
115=d70x58.img POS 1.0000
116=d90x78.img POS 1.0000
117=d110x98.img POS 1.0000
118=d130x118.img POS 1.0000
119=d150x138.img POS 1.0000
120=d170x158.img POS 1.0000
121=d190x178.img POS 1.0000
122=d210x198.img POS 1.0000
123=d230x218.img POS 1.0000
124=d250x238.img POS 1.0000
125=rc40.0x40.0
126=cir200.0

*FIG. 3*

| INPUT-UNITS | ENGLISH | | |
|---|---|---|---|
| WHEEL | 1 | | |
| CIRCLE | 40 | | D10 |
| CIRCLE | 65 | | D11 |
| CIRCLE | 85 | | D12 |
| FLASH | 100X80THM | | D13 |
| SQUARE | 65 | | D14 |
| CIRCLE | 500 | | D15 |
| FLASH | CONNECT | | D16 |
| CIRCLE | 131 | | D17 |
| CIRCLE | 165 | | D18 |
| CIRCLE | 26 | | D19 |
| CIRCLE | 110 | | D20 |
| CIRCLE | 150 | | D21 |
| CIRCLE | 120 | | D22 |
| CIRCLE | 200 | | D23 |
| FLASH | TH125 | | D24 |
| SQUARE | 58 | | D25 |
| CIRCLE | 80 | | D26 |
| FLASH | TH100 | | D27 |
| CIRCLE | 58 | | D28 |
| CIRCLE | 125 | | D29 |
| FLASH | TH250 | | D30 |
| CIRCLE | 250 | | D31 |
| CIRCLE | 375 | | D32 |
| FLASH | TH375 | | D33 |
| CIRCLE | 156 | | D34 |
| CIRCLE | 312 | | D35 |
| CIRCLE | 100 | | D37 |
| SQUARE | 100 | 154(a) | D38  154(b) |
| CIRCLE | 116 | | D39 |
| SQUARE | 80 | | D40 |
| CIRCLE | 171 | | D41 |
| CIRCLE | 70 | | D42 |
| LINE | 8 | | D43 |
| LINE | 20 | | D44 |
| LINE | 100 | | D45 |
| LINE | 10 | | D46 |
| LINE | 6 | | D48 |
| LINE | 25 | | D49 |
| LINE | 50 | | D50 |
| LINE | 40 | | D51 |

WHEEL FOR PN200-456-600 REV C
1=cir85.0
2=h100x80.img POS 1.0000
3=rc65.0x65.0
4=cir500.0
5=null.img
6=cir131.0
7=cir165.0
8=cir110.0
9=cir150.0
10=cir120.0
11=h110x80.0.img POS 1.0000
12=rc58.0x58.0
13=cir125.0
14=cir250.0
15=cir375.0
16=cir156.0
17=cir312.0
18=circ100.0x100.0
19=cir116.0
20=cir171.0
21=cir70.0
22=cir6.0
60=cir10.0
61=cir50.0
62=cir20.0
66=cir80.0
67=rc80.0x80.0
69=cir100.0
76=cir65.0
81=cir40.0
90=cir25.0
95=cir8.0
108=cir26.0
111=cir58.0
112=h100x80.img POS 1.0000
126=cir200.0

WHEEL FOR PN200-456-600 REV C

| | |
|---|---|
| R040 | D10 |
| R065 | D11 |
| R085 | D12 |
| TH10080BD20 | D13 |
| S065 | D14 |
| R500 | D15 |
| EMPTY | D16 |
| R131 | D17 |
| R165 | D18 |
| R026 | D19 |
| R110 | D20 |
| R150 | D21 |
| R120 | D22 |
| R200 | D23 |
| S058 | D25 |
| R080 | D26 |
| R058 | D28 |
| R125 | D29 |
| R250 | D31 |
| R375 | D32 |
| R156 | D34 |
| R312 | D35 |
| R100 | D37 |
| S100 | D38 |
| R116 | D39 |
| S080 | D40 |
| R171 | D41 |
| R070 | D42 |
| R008 | D43 |
| R020 | D44 |
| R100 | D45 |
| R010 | D46 |
| R006 | D48 |
| R025 | D49 |
| R050 | D50 |
| R040 | D51 |

APERTURE CONTROL SYSTEM FOR PRINTED CIRCUIT BOARD FABRICATION

BACKGROUND OF THE INVENTION

Circuit boards (PCBs), which are ubiquitous in the electronics field, are typically designed using computer aided design (CAD) workstations or systems. The PCB designer uses the CAD workstation to arrange traces and pads on the PCB so as to minimize electrical interference between components and to maximize the number of components which will fit on the board. Once the PCB is arranged to the satisfaction of the designer, multiple data files, including an artwork file, an aperture file, etc., are generated by the CAD workstation. These files describe the size and the shape of the pads and traces on the board, the location of the pads and traces, and other parameters necessary for the fabrication of the printed circuit board. These files are typically written by the CAD workstation in what is termed Gerber format which provide the parameters to control an optical, laser or other suitable printed circuit board mask plotter which produces the photomasks from which the PCB is fabricated.

Prior to the use of optical or laser mask plotters, the photomasks were made photographically. A light source used in making the mask included an aperture wheel having a series of apertures through which light from the light source passed in order to reach the film. The film ultimately became the photomask. The series of apertures in the aperture wheel determined the size and shape of the light beam reaching the film. The aperture file generated by the CAD workstation was used to select which aperture on the aperture wheel was used for each beam size and shape, for example pad or trace, which was being produced on the PCB.

Present technology utilizes an optical or laser plotter for the production of masks, and as such, no aperture wheel is actually used. Now rather than use a larger aperture to generate a wider trace, the laser beam is merely passed several times over adjacent parallel paths to define the wider trace. The number of times the laser is passed over adjacent paths is determined by the data in the CAD aperture file, which still maintains the name simply for historical reasons.

Although each CAD workstation nominally uses the same Gerber format, there is enough freedom in the format such that each manufacturer of CAD workstations may produce aperture files which differ in their record formats. Thus each manufacturer of PCB optical, laser or other suitable plotters may require that the aperture file used to control the PCB optical, laser or other suitable plotter have yet still other record formats. These differences in the aperture data format typically mean that a human operator must read the aperture files produced by the CAD workstation and reenter the data manually in the record format required by the PCB optical, laser or other suitable plotter. This transcription operation is time consuming, labor intensive and prone to error.

The present invention relates to a system which permits a CAD workstation to produce a data file which may then immediately be used by any PCB optical, laser or other suitable plotter.

SUMMARY OF THE INVENTION

The invention relates to an aperture control system for generating masks. The system includes a computer aided design workstation for generating CAD aperture data, a data converter for reading the aperture data and for generating, in response to the aperture data, converted aperture data, and a PCB optical, laser or other suitable plotter for generating a mask in response to the converted aperture data.

In one embodiment the data converter converts the CAD aperture data to converted aperture data by table look-up, while in another embodiment, the data converter converts the CAD aperture data to converted aperture data by a plurality of shape comparisons during the execution of program instructions.

In yet another embodiment the data converter includes a processor executing instructions for converting aperture data.

In still yet another embodiment the data converter is located within the CAD workstation.

In another embodiment the data converter is located within the PCB optical, laser or other suitable plotter.

In still yet another embodiment the CAD workstation is in communication with the PCB optical, laser or other suitable plotter by modem.

BRIEF DESCRIPTION OF THE DRAWING

These and other features of the invention may be better understood with reference to the accompanying description and drawing in which:

FIG. 3 is an embodiment of a representative shape table used by the embodiment of the invention of FIG. 2a;

FIG. 4 is an embodiment of a representative data input file used by the embodiment of the invention of FIG. 1;

FIG. 5 is an embodiment of a representative data output file produced by the embodiment of the invention of FIG. 2a; and FIG. 6 is another embodiment of a representative data output file produced by the embodiment of the invention of FIG. 2b.

DESCRIPTION OF THE PREFERRED EMBODIMENT

Figure 1:
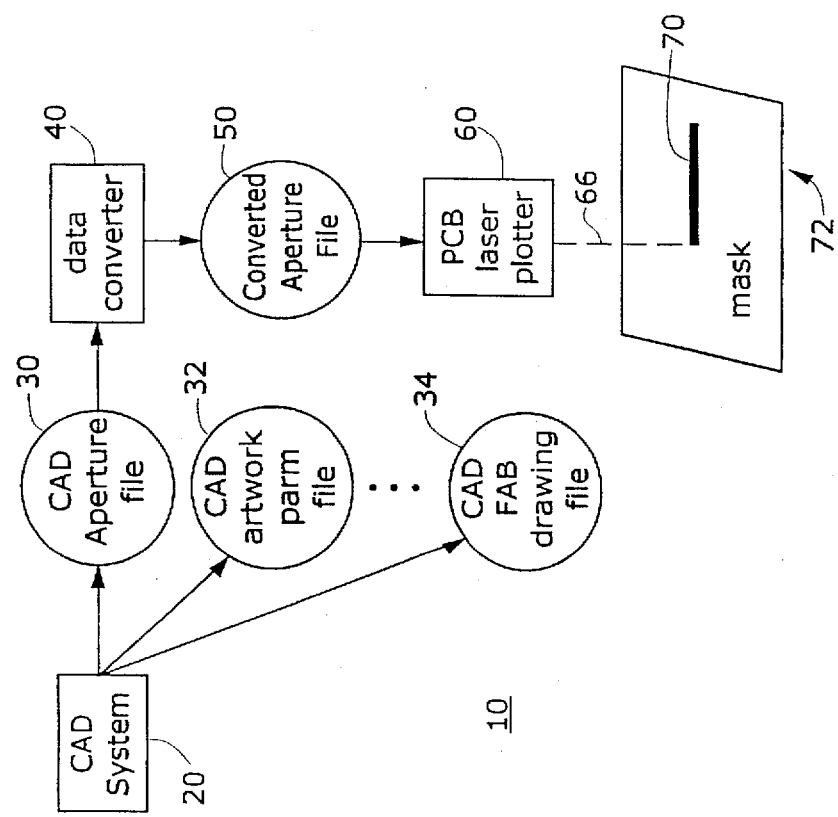
FIG. 1 is a block diagram of an embodiment of an aperture control system of the invention.

Referring to FIG. 1, in brief overview, an embodiment of an aperture control system 10 of the invention includes a CAD workstation 20 having a processor, a graphics display and an input device and executing a CAD program such as, for example, the Allegro CAD program, by Cadence Design Systems, Inc., San Jose, Calif. The input device may include a keyboard, mouse or other input mechanism. The CAD workstation 20 produces a plurality of CAD data files 30, 32, 34 (only three shown for clarity) which contain respectively, aperture information, artwork parameters and the FAB drawing file, as well as other information.

The CAD aperture file 30 is converted by a data converter 40 into a converted aperture file 50 which is readable by a printed circuit board (PCB) optical, laser or other suitable plotter 60. The PCB optical, laser or other suitable plotter 60 uses the information from the converted aperture file 50 to control the movement of a light beam or laser beam 66 to produce a properly sized trace 70 on film 72.

In the embodiment of the aperture control system 10 shown in FIG. 1, the data converter 40 includes a processor, a memory, a display, an input device, and a file reading and generating device such as a disk or tape drive or other storage medium, with which to read the CAD aperture file 30 from a disk or tape or other storage medium and to write the converted aperture file 50 to a disk or tape or other storage medium.

In an alternative embodiment, the data converter 40 may be in direct communication with the CAD workstation 20 and the PCB optical, laser or other suitable plotter 60. For example by using a modem or multiply ported memory, the data converter 40 can thereby read the CAD aperture file 30 directly from the CAD workstation 20 and write the converted aperture file 50 directly to the PCB optical, laser or other suitable plotter 60 without the use of intermediate disk or tape files.

In still yet another alternate embodiment, the data converter 40 may be included in either the CAD workstation 20 or the PCB optical, laser or other suitable plotter 60 and may use the processors available in each of these devices. In one such embodiment, a CAD aperture file 30 would be accessed by a data converter 40 located in the PCB optical, laser or other suitable plotter 60. This file access may be by means of a physical transfer of a physical device such as a disk or tape or by a direct connection, for example by modem, with the CAD workstation 20. In another such embodiment the converted aperture file 50 could be transferred by a data converter 40 located in the CAD workstation 20. This file transfer may be by means of a physical transfer of a physical device such as a tape or disk or by a direct connection, for example by modem, with the PCB optical, laser or other suitable plotter 60.

Figure 2:
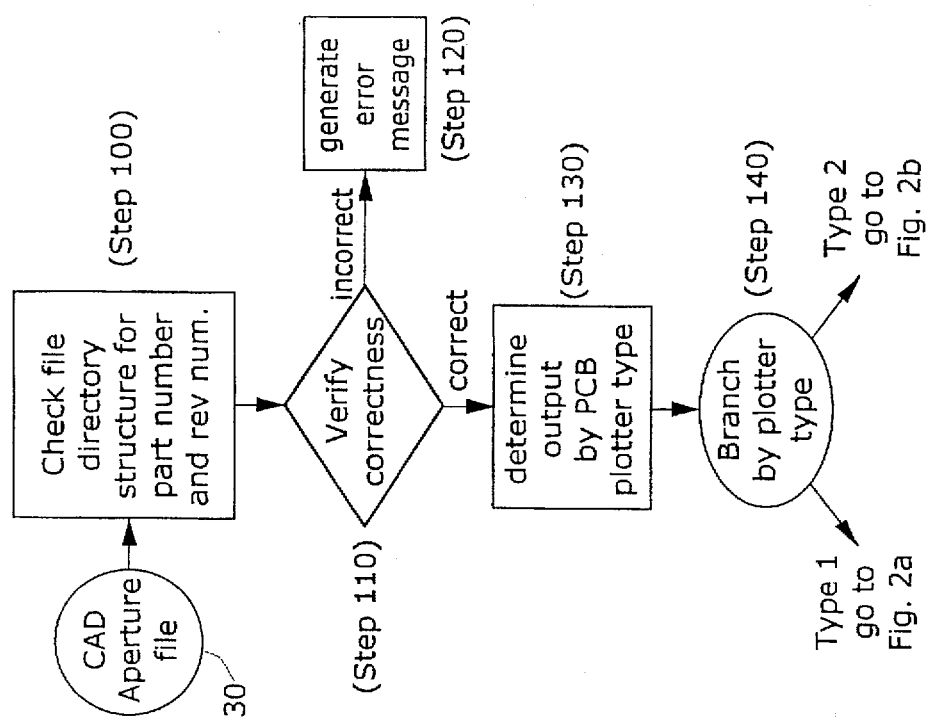
FIGS. 2, 2a, and 2b provide a flowchart of the instructions used in the embodiment of the invention of FIG. 1.

Referring to FIG. 2, the CAD aperture file 30 which is written to disk by the CAD workstation 20 in the embodiment shown, is accessed by the data converter 40. In this embodiment, the part number for the printed circuit board being manufactured and its revision number are encoded by the directory and subdirectory, respectively, in which the CAD aperture file 30 is located on the disk. The data converter 40 checks the directory structure (step 100) and decodes, from the directory structure, the part number and revision number. Thus, for example, a directory structure for a printed circuit board called PCB number ten and having a revision number three might have a directory structure denoted PCB10/REV3. The data converter 40 then displays to an operator this directory structure information in human readable form in order to verify that the correct CAD aperture file is being converted (step 110). If the operator indicates that an incorrect file is being converted, the data converter 40 logs an error message and terminates (step 120). Although in this embodiment the part number and the revision number may be determined from the directory structure on the disk, it is also possible to include this information within the CAD aperture file 30 itself. In this way direct access by the data converter 40 of the CAD aperture file within the CAD workstation 20 may be accomplished without a directory structure. This is useful for example if a modem rather than a disk is being used to transfer the file.

Once the data converter determines that the correct CAD aperture file is being converted, the correct output format is determined (step 130) by the type of the PCB optical, laser or other suitable plotter 60 for which the CAD aperture file 30 is being converted. In the embodiment shown, this information is an input parameter entered by the operator, but other means of specifying the type of PCB optical, laser or other suitable plotter 60, such as other input files, may be used. Once the type of PCB optical, laser or other suitable plotter 60 is determined, the remaining steps executed by the data converter 40 are determined (step 140) by the type of PCB optical, laser or other suitable plotter. In the present embodiment two types of input formats for the PCB optical, laser or other suitable plotter 60 are contemplated. However, other types of input formats for PCB optical, laser or other suitable plotters 60 may be easily added to the system and the data converter 40 may use the same remaining conversion steps as discussed below.

Figure 2A:
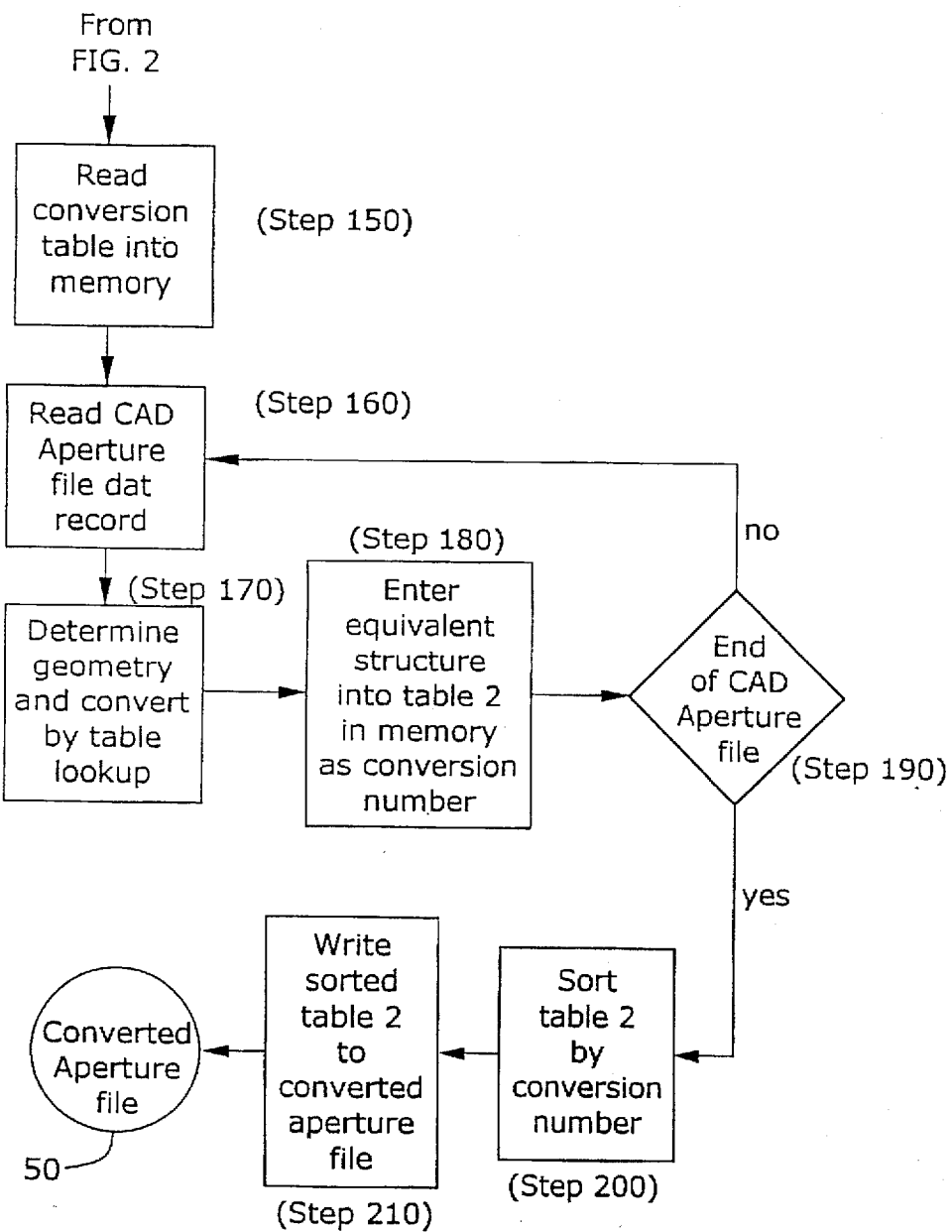
Figure 2B:
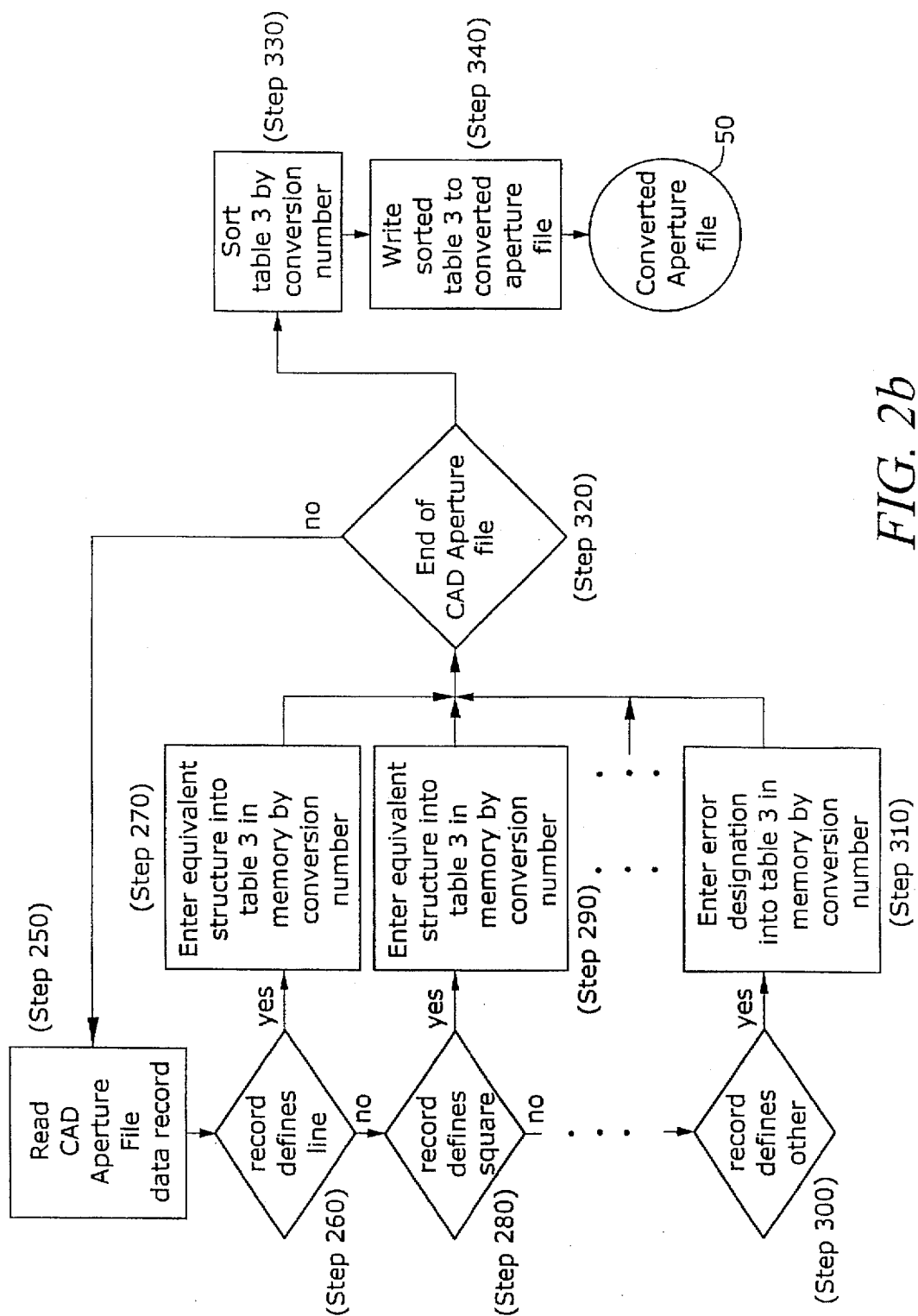

In the embodiment shown, the remaining steps of the conversion are either accomplished by table look-up (FIG. 2a) or by a series of comparisons performed during the execution of the program instructions (FIG. 2b). It should be noted however, that although in this embodiment, the CAD aperture file 30 data for one type of PCB optical, laser or other suitable plotter 60 is converted according to table look-up (FIG. 2a) and the CAD aperture file 30 data for the second type of PCB optical, laser or other suitable plotter 60 is converted by a series of comparisons performed during the execution of the program instructions (FIG. 2b), both conversions could have taken place as well with both using table look-up or both using shape comparisons during the execution of program instructions.

Referring to FIG. 2a, in the embodiment shown, CAD aperture file 30 data to be converted for use by one type of PCB optical, laser or other suitable plotter 60, for example as manufactured by Hadco Corp., Salem, N.H., is converted by first reading a conversion table from disk into memory (step 150). This conversion table (shown in FIG. 3) presents the legal conversion values (left column) for the shape described (right column). For example legal conversion value sixty nine 152 corresponds to a one hundred mil diameter circle 152(a). In this table (FIG. 3), legal numbers from one to twenty four and from two hundred and one to infinity have not been predefined.

The CAD aperture file 30 is then opened and the data records are read (step 160). It should be noted that the opening of the file and the reading of the data records are a result of the CAD aperture file 30 being written to disk by the CAD workstation 20. Had the CAD aperture file 30 in the CAD workstation 20 memory been directly accessed by the data converter 40, an array of CAD aperture file data could have been accessed rather than a disk file record. The CAD aperture file 30, in the embodiment shown, is depicted in FIG. 4. In this embodiment the shape is defined in the leftmost column, the size is defined in the center column, and the corresponding Gerber format number is shown in the rightmost column. Thus the input record for a one hundred mil circle, would have a shape definition as a circle 154, a size as one hundred 154(a) and a Gerber value of D37 154(b). It should be noted that the data in the leftmost and center columns is unnecessary but is included for the benefit of the human operator. Thus the input CAD aperture file 30 and the conversion table may take on other forms.

Once the CAD aperture file 30 record has been read (step 160), the conversion table is used (step 170) to determine the conversion value which is equivalent to the shape defined by the record. This value is written into a table, denoted table 2, located in memory (step 180). If the last data record in the CAD aperture file 30 has not been read (step 190), the next record is accessed (step 160) and the conversion steps (170, 180 and 190) repeated.

If the last record in the CAD aperture file 30 has been read, table 2 is sorted by conversion number (step 200) and written (step 210) as the converted aperture file 50 as shown in FIG. 5. Thus the converted aperture value for the one hundred mil circle discussed with respect to the CAD aperture file 30 discussed above is sixty nine 156. Again, to make the converted aperture file 50 more readable for human operators, a second entry 156(a) connected to the converted aperture value 156 by an equal sign is also listed in the file. As with the CAD aperture file 30, such an entry is not needed.

It should be noted that the sorting (step 200) could have occurred in real time during the writing of the conversion value (step 180) into table 2. Also, if the data converter 40 is in direct communication with the PCB optical, laser or other suitable plotter 60, the sorted table 2 may remain in memory for direct access by the PCB optical, laser or other suitable plotter 60 rather than be written to disk as in the present embodiment.

Referring to FIG. 2b, conversion of aperture data in the CAD aperture file 30 may take place without the use of table look-up by converting the aperture data by a series of comparison or branch instructions during the execution of program instructions. In the present example, data is converted for a PCB optical, laser or other suitable plotter manufactured by Altron, Wilmington, Mass. This process begins by reading (step 250) a record in the CAD aperture file 30. The process then determines if the record defines a line (step 260). If the record defines a line, the equivalent conversion value is entered (step 270) into a table, designated table 3, in memory. Similarly, if the record does not define a line, the record is checked to determine if it defines a square (step 280). If a square is defined, the equivalent conversion value is entered (step 290) into table 3 located in memory. This process is repeated for the other valid geometric shapes. If the record does not contain a valid shape (step 300) an error condition is entered into table 3 (step 310).

Once the appropriate entry is made into table 3, the CAD aperture file is checked (step 320) to determine if the last data record has been read. If the end of the file has been read, the table of conversion values is sorted (step 330) and the sorted table written to disk (step 340) as the converted aperture file 50 as shown in FIG. 6.

In this case, the converted aperture value for a one hundred mil circle listed in the CAD aperture file 30 discussed is R100 158 as shown in the leftmost column. Again, to make the converted aperture file 50 more readable for human operators, a second column lists the Gerber value 158(a) adjacent the converted value. Such an entry is not needed.

As with the table look-up method, the sorting (step 330) could have occurred during the writing of the conversion value (step 270, 290, etc.) into table 3. Further, if the data converter 40 is in direct communication with the PCB optical, laser or other suitable plotter 60, the sorted table 3 may remain in memory for direct access by the PCB optical, laser or other suitable plotter 60 rather than be written to a disk or tape as in the present embodiment.

Once the converted aperture file has been created, the PCB optical, laser or other suitable plotter may use this information to fabricate the PCB mask.

These and other examples of the concept of the invention illustrated above are intended by way of example and the actual scope of the invention is to be determined solely from the following claims.

We claim:

1. A PCB laser plotter data control system comprising:
   a computer aided design workstation for generating CAD aperture data in any one of a plurality of CAD formats for one of at least first and second types of PCB laser plotters;
   a data converter that is operative for said first type of PCB laser plotter for reading said CAD aperture data in said any one of a plurality of CAD formats, for comparing said CAD aperture data in said any one of a plurality of CAD formats to entries in a conversion table of allowable conversion values, and for providing converted aperture data in a prespecified one of a plurality of PCB laser plotter formats from corresponding ones of said allowable conversion values;
   said data converter being operative for said second type of PCB laser plotter for reading said CAD aperture data in said any one of a plurality of CAD formats, for comparing said CAD aperture data in said any one of a plurality of CAD formats to geometric shapes having predefined conversion values, and for providing converted aperture data in a prespecified one of a plurality of PCB laser plotter formats from corresponding ones of said predefined conversion values;
   a PCB laser plotter of one of said at least first and second types of PCB laser plotters disposed in a location remote from said data converter, said PCB laser plotter employing said converted aperture data in said prespecified one of said plurality of PCB laser plotter formats to control a laser beam used in the generation of a PCB mask; and
   a modem operative to transmit said converted aperture data from said data converter directly to said PCB laser plotter for the generation of said PCB mask by said PCB laser plotter.

2. The control system of claim 1 wherein said computer aided design workstation stores said CAD aperture data on a storage medium.

3. The control system of claim 2 wherein said data converter reads said CAD aperture data from said storage medium.

4. The control system of claim 1 wherein said data converter stores said converted aperture data on a storage medium.

5. The control system of claim 4 wherein said PCB laser plotter reads said converted aperture data from said storage medium.

6. The control system of claim 1 wherein said computer aided design workstation is in electrical communication with said data converter and transfers said CAD aperture data to said data converter electrically.

7. The control system of claim 1 wherein said data converter is in electrical communication with said PCB laser plotter and transfers said converted aperture data to said PCB laser plotter electrically.

8. The control system of claim 1, wherein said data converter comprises:
   a bus;
   a memory in electrical communication with said bus;
   a processor in electrical communication with said bus;
   a data input device in electrical communication with said bus, said data input device for reading said CAD aperture data from said computer aided design workstation; and
   a data output device in communication with said bus, said data output device for transmitting said converted aperture data to said PCB laser plotter;
   said processor executing a set of instructions to convert said CAD aperture data in said any one of a plurality of CAD aperture formats to said converted aperture data in said prespecified one of said plurality of PCB laser plotter formats.

9. The control system of claim 8 wherein said set of instructions comprises:
   a read module for reading said CAD aperture data in said any one of a plurality of CAD aperture formats;

a look-up compare module for comparing said CAD aperture data to entries in said conversion table of allowable conversion values; and a write module for writing, into a second table, conversion values corresponding to said CAD aperture data.

10. The control system of claim 9 wherein said set of instructions further comprises a sort module for sorting said conversion values in said second table.

11. The control system of claim 1 wherein said prespecified one of said plurality of PCB laser plotter formats is determined from an operator input.

12. The control system of claim 1 wherein said prespecified one of said plurality of PCB laser plotter formats is determined from an input file.

13. An aperture control system comprising:

a computer aided design system comprising:
  a computer aided design workstation for generating CAD aperture data in any one of a plurality of CAD aperture formats; and
  a data converter for reading said CAD aperture data in said any one of a plurality of CAD formats, for comparing said CAD aperture data in said any one of a plurality of CAD formats to entries in a conversion table of allowable conversion values, and for providing converted aperture data in a prespecified one of a plurality of PCB laser plotter formats from corresponding ones of said allowable conversion values;

a PCB laser plotter disposed in a location remote from said data converter, said PCB plotter employing said converted aperture data in said prespecified one of said plurality of PCB laser plotter formats to control a laser beam used in the generation of a PCB mask; and a modem operative to transmit said converted aperture data from said data converter directly to said PCB laser plotter for the generation of said PCB mask by said PCB laser plotter.

14. A PCB laser plotter data control system comprising:

a computer aided design workstation for generating CAD aperture data in any one of a plurality of CAD formats;

a data converter for reading said CAD aperture data in said any one of a plurality of CAD formats, for comparing said CAD aperture data in said any one of a plurality of CAD formats to geometric shapes having predefined conversion values, and for storing in a table converted aperture data in a prespecified one of a plurality of PCB laser plotter formats from corresponding ones of said predefined conversion values;

a PCB laser plotter disposed in a location remote from said data converter, said PCB laser plotter employing said converted aperture data from said table in said prespecified one of said plurality of PCB plotter formats to control a laser beam used in the generation of a PCB mask; and a modem operative to transmit said converted aperture data from said data converter directly to said PCB laser plotter for the generation of said PCB mask by said PCB laser plotter.

15. The control system of claim 14, wherein said data converter comprises:

a bus;
a memory in electrical communication with said bus;
a processor in electrical communication with said bus;
a data input device in electrical communication with said bus, said data input device for reading said CAD aperture data from said computer aided design workstation; and a data output device in communication with said bus, said data output device for transmitting said converted aperture data to said PCB laser plotter;

said processor executing a set of instructions to convert said CAD aperture data in said any one of a plurality of CAD aperture formats to said converted aperture data in said prespecified one of said plurality of PCB laser plotter formats.

16. The control system of claim 15 wherein said set of instructions comprises:

a read module for reading said CAD aperture data in said any one of a plurality of CAD aperture formats;

a compare module for comparing said CAD aperture data to geometric shapes having predefined conversion values; and a write module for writing, into a table, conversion values corresponding to said CAD aperture data.

17. The control system of claim 16 wherein said set of instructions further comprises a sort module for sorting said conversion values in said table.

18. An aperture control system comprising:

a computer aided design system comprising:
  a computer aided design workstation for generating CAD aperture data in any one of a plurality of CAD aperture formats; and
  a data converter for reading said CAD aperture data in said any one of a plurality of CAD formats, for comparing said CAD aperture data in said any one of a plurality of CAD formats to geometric shapes having predefined conversion values, and for storing in a table converted aperture data in a prespecified one of a plurality of PCB laser plotter formats from corresponding ones of said predefined conversion values;

a PCB laser plotter disposed in a location remote from said data converter, said PCB laser plotter employing said converted aperture data from said table in said prespecified one of said plurality of PCB laser plotter formats to control a laser beam used in the generation of a PCB mask; and a modem operative to transmit said converted aperture data from said data converter directly to said PCB laser plotter for the generation of said PCB mask by said PCB laser plotter.

19. A method of generating printed circuit board masks comprising the steps of:

reading CAD aperture data in any one of a plurality of CAD aperture formats from a CAD workstation;

comparing said CAD aperture data in said any one of a plurality of CAD aperture formats to entries in a conversion table of allowable conversion values;

providing converted aperture data in a prespecified one of a plurality of PCB laser plotter formats from corresponding ones of said allowable conversion values; and transmitting said converted aperture data in said prespecified one of said plurality of PCB laser plotter formats directly to a remote PCB laser plotter by a modem, wherein said remote PCB laser plotter employs said converted aperture data to control a laser beam used in the generation of a PCB mask.

20. The method of claim 19 wherein said step of providing converted aperture data in a prespecified one of a plurality of PCB laser plotter formats comprises the step of:

writing, into a second table, conversion values corresponding to said CAD aperture data.

21. The method of claim 20 further comprising the step of sorting said conversion values in said second table.

22. The method of claim 19 wherein the step of providing converted aperture data in a prespecified one of a plurality of PCB laser plotter formats comprises providing converted aperture data in a PCB laser plotter format that is specified by an operator.

23. The method of claim 19 wherein the step of providing converted aperture data in a prespecified one of a plurality of PCB laser plotter formats comprises providing converted aperture data in a PCB laser plotter format that is specified by an input file.

24. A PCB laser plotter data control system comprising:
a computer aided design workstation for generating CAD aperture data in any one of a plurality of CAD formats;
a data converter for reading said CAD aperture data in said any one of a plurality of CAD formats, for comparing said CAD aperture data in said any one of a plurality of CAD formats to entries in a conversion table of allowable conversion values, and for providing converted aperture data in a prespecified one of a plurality of PCB laser plotter formats from corresponding ones of said allowable conversion values; and
a PCB laser plotter for generating a PCB mask based upon said converted aperture data in said prespecified one of said plurality of PCB laser plotter formats, said PCB laser plotter employing said converted aperture data in said prespecified one of said plurality of PCB laser plotter formats to control a laser beam used in the generation of said PCB mask.

25. The control system of claim 24, wherein said data converter comprises;
a bus;
a memory in electrical communication with said bus;
a processor in electrical communication with said bus;
a data input device in electrical communication with said bus, said data input device for reading said CAD aperture data from said computer aided workstation; and
a data output device in communication with said bus, said data output device for transmitting said converted aperture data directly to said PCB laser plotter by a modem;
said processor executing a set of instructions to convert said CAD aperture data in said any one of a plurality of CAD aperture formats to said converted aperture data in said prespecified one of said plurality of PCB laser plotter formats.

26. The control system of claim 25 wherein said set of instructions comprises:
a read module for reading said CAD aperture data in said any one of a plurality of CAD aperture formats;
a compare module for comparing said CAD aperture data to entries in said conversion table of allowable conversion values; and
a write module for writing, into a second table, conversion values corresponding to said CAD aperture data.

27. The control system of claim 26 wherein said set of instructions further comprises a sort module for sorting said conversion values in said second table.

28. An aperture control system comprising:
a computer aided design system comprising:
a computer aided design workstation for generating CAD aperture data in any one of a plurality of CAD formats; and
a data converter for reading said CAD aperture data in said any one of a plurality of CAD formats, for comparing said CAD aperture data in said any one of a plurality of CAD formats to entries in a conversion table of allowable conversion values, and for providing converted aperture data in a prespecified one of a plurality of PCB laser plotter formats from corresponding ones of said allowable conversion values; and
a PCB laser plotter for generating a PCB mask based upon said converted aperture data in said prespecified one of said plurality of PCB laser plotter formats, said PCB laser plotter employing said converted aperture data in said prespecified one of said plurality of PCB laser plotter formats to control a laser beam used in the generation of said PCB mask.

29. A method of generating printed circuit board masks comprising the steps of:
reading CAD aperture data in any one of a plurality of CAD aperture formats from a CAD workstation;
comparing said CAD aperture data in said any one of a plurality of CAD aperture formats to geometric shapes having predefined conversion values;
storing in a table converted aperture data in a prespecified one of a plurality of PCB laser plotter formats from corresponding ones of said predefined conversion values; and
transmitting said converted aperture data in said prespecified one of said plurality of PCB laser plotter formats directly to a remote PCB laser plotter by a modem, wherein said remote PCB laser plotter employs said converted aperture data to control a laser beam used in the generation of a PCB mask.

30. The method of claim 29 wherein said step of providing converted aperture data in a prespecified one of a plurality of PCB laser plotter formats comprises the step of:
writing, into a table, conversion values corresponding to said CAD aperture data.

31. The method of claim 30 further comprising the step of sorting said conversion values in said table.

32. A PCB laser plotter data control system comprising:
a computer aided design workstation for generating CAD aperture data in any one of a plurality of CAD formats;
a data converter for reading said CAD aperture data in said any one of a plurality of CAD formats, for comparing said CAD aperture data in said any one of a plurality of CAD formats to geometric shapes having predefined conversion values, and for storing in a table converted aperture data in a prespecified one of a plurality of PCB laser plotter formats from corresponding ones of said predefined conversion values; and
a PCB laser plotter for generating a PCB mask based upon said converted aperture data in said prespecified one of said plurality of PCB laser plotter formats, said PCB laser plotter employing said converted aperture data from said table in said prespecified one of said plurality of PCB laser plotter formats to control a laser beam used in the generation of said PCB mask.

33. The control system of claim 32, wherein said data converter comprises:
a bus;
a memory in electrical communication with said bus;
a processor in electrical communication with said bus;
a data input device in electrical communication with said bus, said data input device for reading said CAD aperture data from said computer aided design workstation; and a data output device in communication with said bus, said data output device for transmitting said converted aperture data directly to said PCB laser plotter by a modem;

said processor executing a set of instructions to convert said CAD aperture data in said any one of a plurality of CAD aperture formats to said converted aperture data in said prespecified one of said plurality of PCB laser plotter formats.

34. The control system of claim 33 wherein said set of instructions comprises:

a read module for reading said CAD aperture data in said any one of a plurality of CAD aperture formats;

a compare module for comparing said CAD aperture data to geometric shapes having predefined conversion values; and a write module for writing, into a table, conversion values corresponding to said CAD aperture data.

35. The control system of claim 34 wherein said set of instructions further comprises a sort module for sorting said conversion values in said table.

36. An aperture control system comprising:

a computer aided design system comprising:

a computer aided design workstation for generating CAD aperture data in any one of a plurality of CAD aperture formats; and a data converter for reading said CAD aperture data in said any one of a plurality of CAD formats, for comparing said CAD aperture data in said any one of a plurality of CAD formats to geometric shapes having predefined conversion values, and for storing in a table converted aperture data in a prespecified one of a plurality of PCB laser plotter formats from corresponding ones of said predefined conversion values; and a PCB laser plotter for generating a PCB mask based upon said converted aperture data in said prespecified one of said plurality of PCB laser plotter formats, said PCB laser plotter employing said converted aperture data from said table in said prespecified one of said plurality of PCB laser plotter formats to control a laser beam used in the generation of said PCB mask.

37. A method of generating printed circuit board masks comprising the steps of:

reading CAD aperture data in any one of a plurality of CAD aperture formats from a CAD workstation;

comparing said CAD aperture data in said any one of a plurality of CAD aperture formats to entries in a conversion table of allowable conversion values;

providing converted aperture data in a prespecified one of a plurality of PCB plotter formats from corresponding ones of said allowable conversion values;

transmitting said converted aperture data in said prespecified one of said plurality of PCB plotter formats directly to a PCB plotter; and generating a PCB mask by having said PCB plotter use said converted aperture data in said prespecified one of said plurality of PCB plotter formats to control a light beam.

38. The method of claim 37 wherein said step of providing converted aperture data in a prespecified one of a plurality of PCB plotter formats comprises the step of:

writing, into a second table, conversion values corresponding to said CAD aperture data.

39. The method of claim 38 further comprising the step of sorting said conversion values in said second table.

40. A method of generating printed circuit board masks comprising the steps of:

reading CAD aperture data in any one of a plurality of CAD aperture formats from a CAD workstation;

comparing said CAD aperture data in said any one of a plurality of CAD aperture formats to geometric shapes having predefined conversion values;

storing in a table converted aperture data in a prespecified one of a plurality of PCB plotter formats from corresponding ones of said predefined conversion values;

transmitting said converted aperture data in said prespecified one of said plurality of PCB plotter formats directly to a PCB plotter; and generating a PCB mask by having said PCB plotter use said converted aperture data in said prespecified one of said plurality of PCB plotter formats to control a light beam.

41. The method of claim 40 wherein said step of providing converted aperture data in a prespecified one of a plurality of PCB plotter formats comprises the step of:

writing, into a table, conversion values corresponding to said CAD aperture data.

42. The method of claim 41 further comprising the step of sorting said conversion values in said table.

* * * * *

UNITED STATES PATENT AND TRADEMARK OFFICE
CERTIFICATE OF CORRECTION

PATENT NO. : 5,751,594
DATED : May 12, 1998
INVENTOR(S) : Rick J. Stanley, et al.

It is certified that error appears in the above-identified patent and that said Letters Patent is hereby corrected as shown below:

Column 7, line 1, claim 9, "a look-up compare module" should read --a compare module--.

Signed and Sealed this

Second Day of November, 1999

Attest:

Attesting Officer

Q. TODD DICKINSON

Acting Commissioner of Patents and Trademarks